United States Patent [19]
Sichanugrist et al.

[11] Patent Number: 5,133,809
[45] Date of Patent: Jul. 28, 1992

[54] PHOTOVOLTAIC DEVICE AND PROCESS FOR MANUFACTURING THE SAME

[75] Inventors: Porponth Sichanugrist; Hirohisa Suzuki; Hirofumi Nishi, all of Tokyo, Japan

[73] Assignee: Showa Shell Sekiyu K.K., Tokyo, Japan

[21] Appl. No.: 593,838

[22] Filed: Oct. 5, 1990

[30] Foreign Application Priority Data

Oct. 7, 1989 [JP] Japan .................................. 1-262639

[51] Int. Cl.[5] .................... H01L 31/05; H01L 31/18
[52] U.S. Cl. .................... 136/249; 136/258; 437/4; 437/173; 437/205
[58] Field of Search .................. 437/4, 173, 205; 136/244, 249 MS, 258 AM

[56] References Cited

U.S. PATENT DOCUMENTS

| | | | |
|---|---|---|---|
| 4,517,403 | 5/1985 | Morel et al. | 136/249 |
| 4,675,467 | 6/1987 | Van Dine et al. | 136/249 |
| 4,724,011 | 2/1988 | Turner et al. | 136/249 |
| 4,936,924 | 6/1990 | Inuzuka | 136/249 MS |
| 4,968,354 | 11/1990 | Nishiura et al. | 136/244 |

FOREIGN PATENT DOCUMENTS

| | | | |
|---|---|---|---|
| 2577716 | 8/1986 | France | 136/244 |
| 61-280680 | 12/1986 | Japan | 136/244 |
| 62-89368 | 4/1987 | Japan | 136/244 |
| 1-61963 | 3/1989 | Japan | 136/249 MS |

*Primary Examiner*—Aaron Weisstuch
*Attorney, Agent, or Firm*—Sughrue, Mion, Zinn, Macpeak & Seas

[57] ABSTRACT

A photovoltaic device and a process for manufacturing a photovoltaic device which includes providing a plurality of spaced transparent electrode layer regions on an insulating transparent substrate plate, forming an amorphous semiconductor layer over the spaced transparent electrode layer regions, forming a patterned conductive printed electrode layer over the amorphous semiconductor layer to form a plurality of photovoltaic regions, and then irradiating the photovoltaic regions with a laser beam from the substrate plate side to heat and melt the transparent electrode, amorphous semiconductor, and conductive printed electrode in each photovoltaic region, thereby forming in each photovoltaic region a conductive path made of an alloy formed by the melting, thus electrically connecting the photovoltaic regions in series.

6 Claims, 2 Drawing Sheets

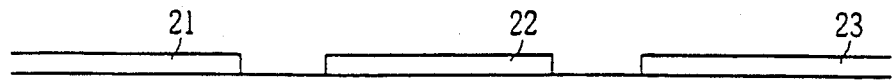
FIG.1a
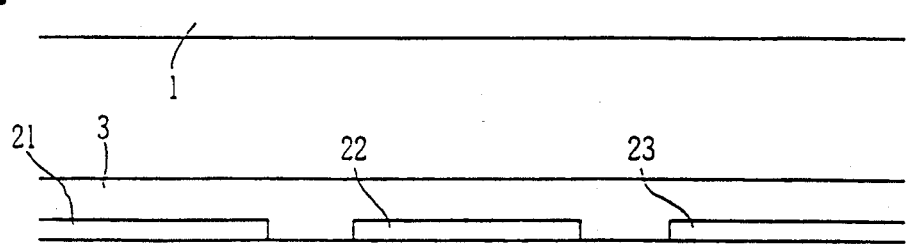
FIG.1b
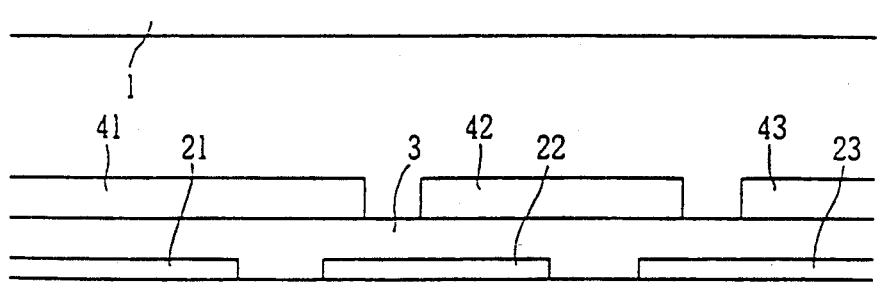
FIG.1c
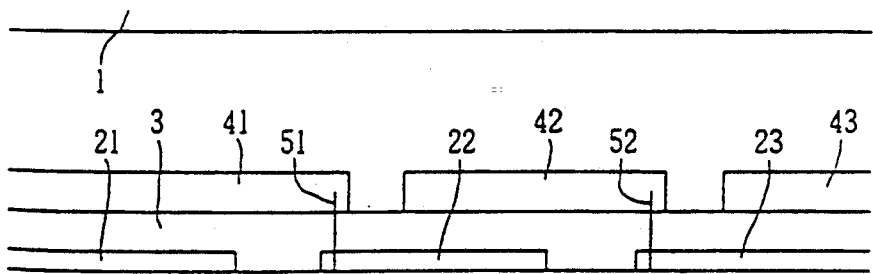
FIG.1d

PHOTOVOLTAIC DEVICE AND PROCESS FOR MANUFACTURING THE SAME

FIELD OF THE INVENTION

The present invention relates to a photovoltaic device for use as a solar cell, photosensor, or the like, and more particularly, to a thin-film photovoltaic device having a plurality of photovoltaic regions connected in series, and also relates to a process for manufacturing the photovoltaic device.

BACKGROUND OF THE INVENTION

Film-type semiconductor conductive modules which have conventionally been utilized as solar cells, photosensors, etc. have a thin-film construction in which units each having a number of photovoltaic regions connected in series are arranged on the same plane in order that the modules capture as much light as possible in limited spaces and convert the light into electric energy.

FIG. 3 is a plan view illustrating the construction of a conventional amorphous silicon (hereinafter referred to as a-Si) solar cell in which solar cell unit elements are connected in series on an insulating substrate plate, each solar cell unit element comprising a transparent electrode layer, an a-Si layer as an amorphous semiconductor layer, and a conductive printed electrode layer as a back electrode layer, superposed in this order. As illustrated, this a-Si solar cell comprises a single glass substrate plate 1 and, superposed thereon, a transparent electrode layer 2 (21-23), an a-Si layer 3 (31-33), and a conductive printed electrode layer 4 (41-43), thus forming a plurality of solar cell unit elements. These solar cell unit elements are connected in series by bringing the conductive printed electrode layer in an element into contact with the transparent electrode layer of an adjacent element.

In manufacturing this kind of solar cell, a transparent conductive film, such as an ITO (indium tin oxide) or SnO$_2$ (tin oxide) film or the like, is first formed over a glass substrate plate 1 at a thickness of about 500 to 10,000 Å by electron beam vapor deposition, sputtering, or the thermal CVD process. A transparent electrode layer 2 is then formed by patterning the transparent conductive film by means of a laser beam, or by forming a patterned photoresist on the transparent conductive film by photolithography and subjecting the resulting transparent conductive film to etching.

An a-Si layer 3 is then formed, for example, by depositing on the transparent electrode layer 2 a p-type a-Si layer at a thickness of about 200 Å, an undoped a-Si layer at 0.2–1 μm, and an n-type a-Si layer at about 500 Å, by the plasma discharge decomposition of silane gases. The p-type a-Si is obtained by doping boron and carbon, while the n-type a-Si is obtained by doping phosphorus. The thus-formed a-Si layer 3 is patterned, or divided, into regions 31, 32, and 33 by means of a laser beam. Subsequently, a patterned conductive back electrode layer 4 is formed by printing to prepare a solar cell.

If, in the above process, a YAG laser beam used to pattern the transparent conductive film and having a wavelength of 1.06 μm is used for the patterning of the a-Si layer, the power of the laser beam should be heightened because of the low absorbance of the a-Si layer, and patterning of the a-Si layer with such a higher-power laser beam damages the transparent electrode layer at the regions 26 and 27 shown in FIG. 3 which are exposed to the laser beam. In order to avoid such a problem, a YAG laser beam with a wavelength of 0.53 μm, which is well absorbed by a-Si layers, has conventionally been used for the patterning of a-Si layers. Therefore, conventional patterning has been disadvantageous in that the laser necessarily has a complicated structure because it should be so constructed as to emit laser beams with different wavelengths respectively suited for transparent conductive films and a-Si layers, and that good reproducibility is not obtained because reflectance varies depending on the state of a-Si layer surfaces.

SUMMARY OF THE INVENTION

Accordingly, an object of the present invention is to provide a process for manufacturing a photovoltaic device, by which process a conductive path connecting a transparent electrode layer with a conductive printed electrode layer can be formed without being affected by the surface state and thickness of an a-Si layer.

Another object of the present invention is to provide a photovoltaic device having high reliability and stable properties.

The above and other objects are accomplished with a process for manufacturing a photovoltaic device which comprises providing a plurality of spaced transparent electrode layer regions on an insulating transparent substrate plate, forming an amorphous semiconductor layer over the spaced transparent electrode layer regions, forming a patterned conductive printed electrode layer over the amorphous semiconductor layer to form a plurality of photovoltaic regions, and then irradiating the photovoltaic regions with a laser beam from the substrate plate side to heat and melt the transparent electrode, amorphous semiconductor, and conductive printed electrode in each photovoltaic region, thereby forming in each photovoltaic region a conductive path made of an alloy formed by the melting, thus electrically connecting the photovoltaic regions in series.

In a preferred embodiment of the present invention, the conductive path for each photovoltaic region is formed so as not to extend through the conductive printed electrode layer.

In another preferred embodiment of this invention, the spaced transparent electrode layer regions are formed by patterning a transparent conductive film formed on the substrate plate and this patterning is performed by means of a laser beam having the same wavelength as that of the laser beam used for forming the conductive paths. The wavelength of this laser beam is 1.06 μm.

The photovoltaic device of the present invention has a plurality of photovoltaic regions which comprise a plurality of spaced transparent electrode layer regions provided on an insulating transparent substrate plate, an amorphous semiconductor layer formed over the spaced transparent electrode layer regions, and a patterned conductive printed electrode layer formed over the amorphous semiconductor layer, said patterned conductive printed electrode layer consisting of a plurality of printed electrode regions each overlapping an adjacent transparent electrode layer region through the amorphous semiconductor layer, said photovoltaic regions being electrically connected with each other in series by conductive paths made of an alloy formed by irradiating the photovoltaic regions with a laser beam from the substrate plate side to heat and melt the transparent electrode layer, amorphous semiconductor layer, and conductive printed electrode layer in each photovoltaic region, each conductive path not extending through the conductive printed electrode layer.

BRIEF DESCRIPTION OF THE DRAWINGS

FIG. 1 (a) to (d) are schematic views illustrating the steps of a process for manufacturing a photovoltaic device according to the present invention;

DETAILED DESCRIPTION OF THE INVENTION

Upon irradiation with a laser beam from the substrate plate side, not only the transparent electrode layer and a-Si layer in each photovoltaic region but the conductive printed electrode layer in an adjacent photovoltaic region are heated and, as a result, the irradiated portion of the transparent electrode layer and conductive printed back electrode layer are melted to form an alloy, which provide a conductive path. Thus, the transparent electrode layer in each photovoltaic region is internally connected by the conductive path with the conductive printed electrode layer in the adjacent photovoltaic region, thereby giving a series connection. Due to the irradiation with a laser beam by the above method, conductive paths can be formed without being affected by the surface state and thickness of the a-Si layer. Further, since the conductive printed electrode layer has a sufficient thickness, the conductive paths can be formed so as not to extend through the conductive printed electrode layer by controlling the power of the laser beam. Hence, photovoltaic devices can be produced with good reproducibility. Furthermore, the wavelength of the laser beam used in the process of the invention can be limited to 1.06 μm, which is suited for the patterning of the transparent electrode layer, and the irradiating device can have a simple construction.

Figure 2:
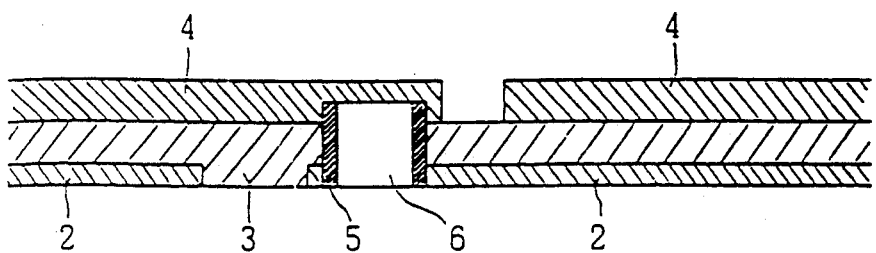
FIG. 2 is an enlarged sectional view of a conductive path area of the structure of FIG. 1 (d)
Figure 3:
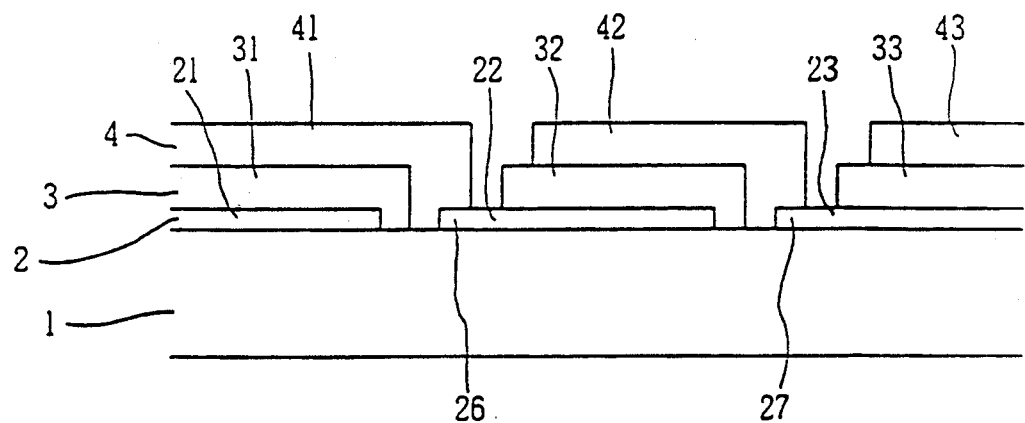
FIG. 3 is a plan view illustrating the construction of a conventional solar cell.

FIG. 1 (a) to (d) illustrate the steps of a process for manufacturing an amorphous silicon solar cell as one embodiment of the photovoltaic device of this invention. In FIGS. 1 and 3, like portions or parts are designated by like numerals or symbols. First, as shown in FIG. 1 (a), a transparent conductive film of $SnO_2$ which has been formed on a glass substrate plate 1 at a thickness of 800 Å by thermal CVD is patterned by means of a YAG laser beam with a wavelength of 1.06 μm to form a transparent electrode layer 2 (21-23). Subsequently, an a-Si layer 3 having a pin junction is formed by the plasma CVD process at a thickness of about 0.8 μm as shown in FIG. 1 (b). Over the a-Si layer 3, a conductive printed electrode layer 4 (41-43) is formed by printing at a thickness of 10 to 30 μm as shown in FIG. 1 (c). The conductive printed electrode layer 4 has been formed such that each region thereof overlaps an adjacent region of the transparent electrode layer 2 through the a-Si layer 3. Connection between solar cell unit elements is established at this portion where a conductive printed electrode layer region overlaps an adjacent transparent electrode layer region. That is, when this portion of each photovoltaic region is irradiated with a laser beam with a wavelength of 1.06 μm from the glass substrate plate side, the irradiated portion of the transparent electrode layer 2 and a-Si layer 3 are heated and melted along with the irradiated portion of the conductive printed electrode layer 4 of the adjacent photovoltaic region to form an alloy 6, which provides conductive paths 5 (51 and 52) as shown in FIG. 2. The conductive paths 5 connect the conductive printed electrode layer regions 41 and 42 with the transparent electrode layer regions 22 and 23, respectively. Thus, an a-Si solar cell is fabricated in which solar cell unit elements are connected in series.

As the material for the conductive printed electrode layer, use may be made of a paste which contains Ni particles as a filler and a resin as a binder and is able to be calcined at a relatively low temperature of 150° to 200° C.

As the material for the transparent electrode layer, ITO, $SnO_2$, and ZnO can be used, for example.

As the material for the amorphous semiconductor layer, a-Si and a-Ge can be used, for example.

A solar cell as an application of the photovoltaic device of this invention has achieved a conversion efficiency of 7% or more at an incident light illuminance of 200 lux.

As described above, since according to the present invention, the irradiation with a laser beam for forming conductive paths for connecting the photovoltaic regions is effected through the insulating transparent substrate plate, the conductive paths can be formed without adversely affecting the conductive printed electrode layer even if the power of the laser beam is increased to some degree, and without being affected by a difference in the reflectance of the a-Si layer due to a change in the surface state and thickness of the layer. Therefore, photovoltaic devices can be fabricated with good reproducibility.

Furthermore, since the conductive paths connecting solar cell unit elements are made of an alloy formed by irradiation from the substrate plate side and can be prevented from being exposed, the photovoltaic device can have improved reliability and show stable and high-efficiency output properties.

Moreover, since a laser beam having a wavelength suited for the patterning of the transparent electrode film can be used for the formation of the conductive paths, the irradiating device can be of a simpler structure, so that the production cost can be reduced.

While the invention has been described in detail and with reference to specific embodiments thereof, it will be apparent to one skilled in the art that various changes and modifications can be made therein without departing from the spirit and scope thereof.

We claim:

1. A process for manufacturing a photovoltaic device, comprising:

forming by means of a laser beam a plurality of spaced transparent electrode layer regions on an insulating transparent substrate plate, forming a continuous amorphous semiconductor layer over the spaced transparent electrode layer regions, forming a patterned conductive printed electrode layer over the amorphous semiconductor layer to form a plurality of photovoltaic regions, and irradiating the photovoltaic regions with a laser beam from the substrate plate side to heat and melt the transparent electrode layer, amorphous semiconductor layer, and conductive printed electrode layer in each photovoltaic region, thereby forming in each photovoltaic region a conductive path made of an alloy formed by the melting, thus electrically connecting the photovoltaic regions in series, said transparent electrode layer regions being formed by a laser beam having the same wavelength as that used for forming said conductive paths, wherein said irradiating step is performed such that said conductive path extends completely through the thickness of said spaced transparent electrode and said amorphous semiconductor layer to reach said patterned conductive printed electrode layer, formation of said conductive paths having no adverse effect on said patterned conductive printed electrode layer.

2. A process according to claim 1, wherein the conductive path formed in each photovoltaic region does not extend through the conductive printed electrode layer.

3. A process according to claim 1, wherein the conductive printed electrode layer is formed from a paste containing a resin binder and Ni particles as a filler.

4. A process according to claim 1, wherein the spaced transparent electrode layer regions are formed by patterning a continuous transparent conductive film formed on the substrate plate.

5. A process according to claim 1, wherein the wavelength of the laser beam is 1.06 μm.

6. A photovoltaic device, comprising:
a plurality of photovoltaic regions which comprise a plurality of spaced transparent electrode layer regions formed by means of a laser beam provided on an insulating transparent substrate plate,
a continuous amorphous semiconductor layer formed over the spaced transparent electrode layer regions, and
a patterned conductive printed electrode layer formed over the amorphous semiconductor layer, said patterned conductive printed electrode layer comprising a plurality of printed electrode regions each overlapping an adjacent transparent electrode layer region through the amorphous semiconductor layer,
said photovoltaic regions being electrically connected together in series by conductive paths made of an alloy formed by irradiating the photovoltaic regions with a laser beam from the substrate plate side to heat and melt the transparent electrode layer, amorphous semiconductor layer, and conductive printed electrode layer in each photovoltaic region, each conductive path not extending through the conductive printed electrode layer,
said transparent electrode layer regions being formed by a laser beam having the same wavelength as that used for forming said conductive paths, wherein said conductive path extends completely through the thickness of said spaced transparent electrode and said amorphous semiconductor layer to reach said patterned conductive printed electrode layer, formation of said conductive paths having no adverse effect on said patterned conductive printed electrode layer.

* * * * *